US008995187B2

(12) United States Patent
Tsai

(10) Patent No.: US 8,995,187 B2
(45) Date of Patent: Mar. 31, 2015

(54) NONVOLATILE SEMICONDUCTOR MEMORY DEVICE PROGRAMMABLE VIA OVERLAPPING PULSE SIGNALS

(71) Applicant: Elite Semiconductor Memory Technology Inc., Hsinchu (TW)

(72) Inventor: Cheng-Hung Tsai, New Taipei (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 136 days.

(21) Appl. No.: 13/760,969

(22) Filed: Feb. 6, 2013

(65) Prior Publication Data

US 2014/0219029 A1 Aug. 7, 2014

(51) Int. Cl.
*G11C 16/04* (2006.01)
*G11C 16/10* (2006.01)

(52) U.S. Cl.
CPC .................................... *G11C 16/10* (2013.01)
USPC ............ 365/185.11; 365/185.18; 365/185.19; 365/185.28

(58) Field of Classification Search
CPC ................................ G11C 16/10; G11C 16/30
USPC .............. 365/185.11, 185.18, 185.19, 185.28
See application file for complete search history.

(56) References Cited

U.S. PATENT DOCUMENTS

2008/0192545 A1* 8/2008 Chen ......................... 365/185.11
2011/0235456 A1* 9/2011 Jin ................................. 365/226

* cited by examiner

*Primary Examiner* — Hoai V Ho
(74) *Attorney, Agent, or Firm* — Juan Carlos A. Marquez; Bacon & Thomas PLLC

(57) ABSTRACT

A method for programming a plurality of memory cells of a nonvolatile semiconductor memory device comprises the steps of: dividing the plurality of memory cells into M number of groups (M is an integer); successively selecting each of the M number of groups; generating M number of successive overlapping pulse signals; and programming the memory cells of the M number of groups in response to the respective M number of successive overlapping pulse signals.

5 Claims, 9 Drawing Sheets

NONVOLATILE SEMICONDUCTOR MEMORY DEVICE PROGRAMMABLE VIA OVERLAPPING PULSE SIGNALS

BACKGROUND OF THE INVENTION

1. Field of the Invention

The present invention relates to a method for programming a plurality of memory cells of a nonvolatile semiconductor memory device.

2. Description of the Related Art

Semiconductor memory devices are devices in which data can be stored and from which stored data can be retrieved. Semiconductor memory devices can be classified into volatile memory and nonvolatile memory. The volatile memory needs a power supply to retain data while the nonvolatile memory can retain data even when power is removed. Therefore, nonvolatile memory devices have been widely used in applications in which power can be interrupted suddenly.

Nonvolatile memory devices comprise electrically erasable and programmable ROM cells, known as flash EEPROM cells. FIG. 1 shows a vertical cross-section of the flash EEPROM cell 10. Referring to FIG. 1, a deep n-type well 12 is formed in a bulk region or a P-type substrate 11, and a p-type well 13 is formed in the n-type well 12. An N-type source region 14 and an N-type drain region 15 are formed in the P-type well 13. A p-type channel region is formed between the source region 14 and the drain region 15. A floating gate 17, which is insulated by an insulating layer 16, is formed on the P-type channel region. A control gate 19, which is insulated by another insulating layer 18, is formed on the floating gate 17.

FIG. 2 shows threshold voltages of the flash EEPROM cell 10 during program and erase operations. Referring to FIG. 2, the flash EEPROM cell 10 has a higher threshold voltage range (about 6 to 7V) during the program operation, and has a lower threshold voltage range (about 1 to 3V) during the erase operation.

Referring to FIGS. 1 and 2, during the program operation, hot electrons need to be injected from the channel region adjacent to the drain region 15 to the floating gate electrode, so that the threshold voltage of the EEPROM cell increases. In contrast, during the erase operation, the hot electrons injected into the floating gate 17 during the program operation need to be removed, so that the threshold voltage of the EEPROM cell will decrease. Therefore, the threshold voltages of the EEPROM cell are varied after the program and erase operation.

FIG. 3 shows a block diagram of a prior art nonvolatile semiconductor memory device 30. Referring to FIG. 3, the memory device 30 comprises a memory array 32, a column decode and level shift circuit 34, a row decode and level shift circuit 36, an I/O circuit 38, and a pump circuit 39.

FIG. 4 shows a part of the memory array 32 of FIG. 3. Referring to FIG. 4, the memory array includes a plurality of word lines WL0 to WL2, a plurality of bit lines BL0 to BL7, and a plurality of memory cell transistors MX,Y arranged in the form of a matrix, wherein letters X and Y respectively stand for a cell position in the horizontal direction and a cell position in the vertical direction. The memory cell transistors MX,Y are connected to word lines in rows and to bit lines in columns. For example, a cell transistor M1,1 has a drain connected to the first bit line BL0 and has a gate connected to the first word line WL0, and a cell transistor M1,2 has a drain connected to the second bit line BL1 and has a gate connected to the first word line WL0.

Referring now to FIG. 3, the I/O circuit 38 receives address signals ADDRESS, data signals DATA, and a clock signal XCLK from a processor or memory controller (not shown). The column decode and level shift circuit 34 receives a column address AC from the I/O circuit 38 for selecting a single bit line from the memory array 32. The row decode and level shift circuit 36 receives a row address AR from the I/O circuit 38 for selecting a single word line from the memory array 32.

During a program operation, the pump circuit 39 receives a mode signal PGM from the I/O circuit 38 for generating pumped output voltages to the circuits 34 and 36. In response to the column address AC, the circuit 34 provides the pumped output voltage to the selected bit line. In response to the row address AR, the circuit 36 provides the pumped output voltage to the selected word line.

FIG. 5 shows a plot of voltage and current waveforms versus time of a typical prior art programming operation. Referring to FIG. 4 and FIG. 5, four memory cell transistors M1,1, M1,2, M1,3, and M1,4 in FIG. 4 are selected to be programmed in response to a column address AC and a row address AR. At time t0, the pump circuit 39 generates a pumped output voltage VC having a level higher than a power supply VDD (e.g., 1.8VDC) and provides the high voltage (e.g., 4VDC) to the drains of the selected memory cell transistors through the bit lines. Upon receiving the pumped voltage VC, the total current IC flowing through the selected memory cell transistors increases to about 220 µA. The voltage VC is maintained at its high level until a time t1 is reached. At time t1, the total current IC flowing through selected memory cell transistors reduces to about 50 µA. After the time t1, the pump circuit 39 stops its operation, and a level of its output voltage VC drops to the power supply VDD. The time period t0 to t1 shown in FIG. 5 is the pulse width, which is the effective time duration for the programming operation. In this example, the time period t0 to t1 is about 1 µS.

As shown in FIG. 5, four memory cell transistors are selected to be programmed during the time period t0 to t1, so that the instant current of about 220 µA is required for the program operation. Presently, semiconductor memory devices have become highly integrated. More than tens of thousands of memory cells are integrated into a single semiconductor memory device so that much more data can be stored. To program a 16K-bit memory device comprising an array of 128×128 memory cells, relatively large amounts of power is required during the operation and the duration of the entire program can be rather long. In order to solve the foregoing problems, there is a need to provide an improved programming method.

SUMMARY OF THE INVENTION

One aspect of the present invention is to provide a method for programming a plurality of memory cells of a nonvolatile semiconductor memory device.

According to one embodiment of the present invention, the method comprises the steps of: dividing the plurality of memory cells into M number of groups (M is an integer); successively selecting each of the M number of groups; generating M number of successive overlapping pulse signals; and programming the memory cells of the M number of groups in response to the respective M number of successive overlapping pulse signals.

Another aspect of the present invention is to provide a nonvolatile semiconductor memory device.

According to one embodiment of the present invention, the nonvolatile semiconductor memory device comprises a plurality of memory cells divided into M number of groups, a decoder, and a timing circuit. The decoder successively selects each of the M number of groups. The timing circuit generates M number of successive overlapping pulse signals. The memory cells of the M number of groups are configured so as to be programmable in response to the respective M number of successive overlapping pulse signals.

BRIEF DESCRIPTION OF THE DRAWINGS

The invention will be described according to the appended drawings in which.

DETAILED DESCRIPTION OF THE INVENTION

Figure 1:
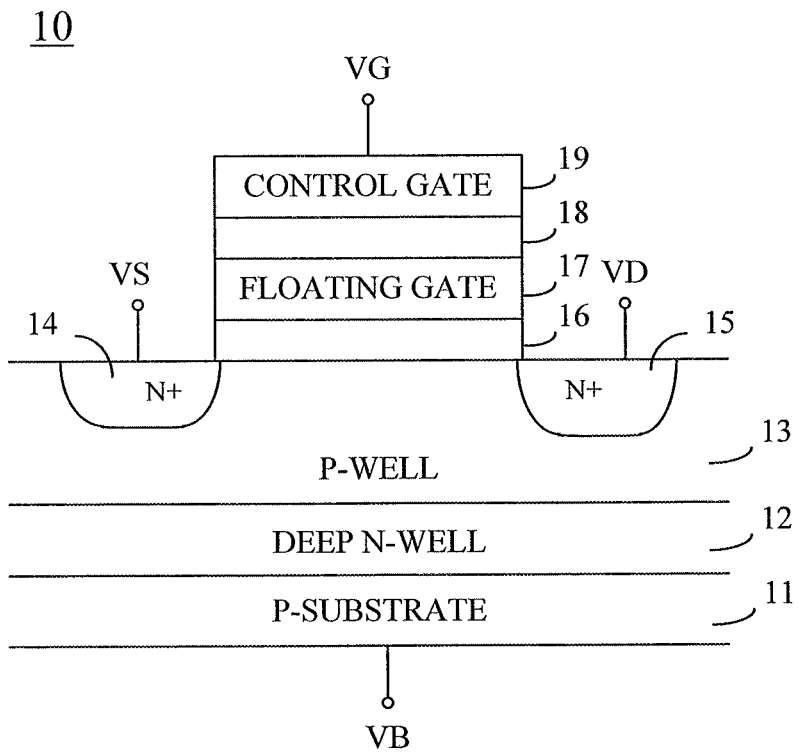
FIG. 1 shows a vertical cross-section of a flash EEPROM cell.
Figure 2:
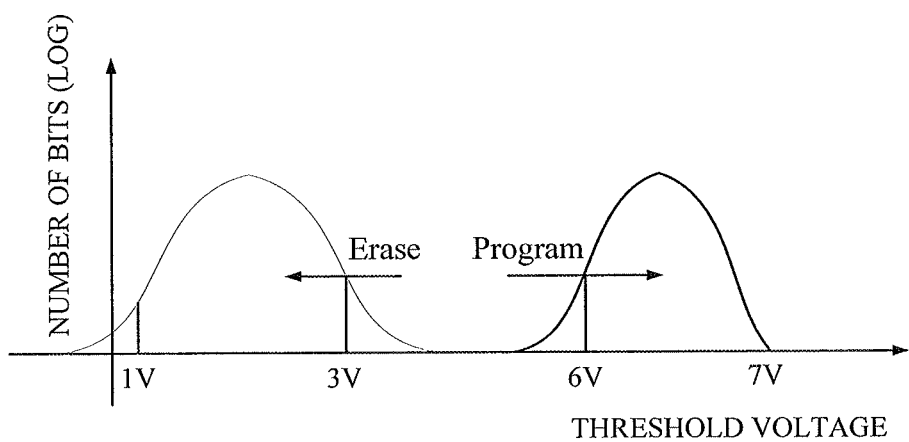
FIG. 2 shows threshold voltages of the flash EEPROM cell during program and erase operations.
Figure 3:
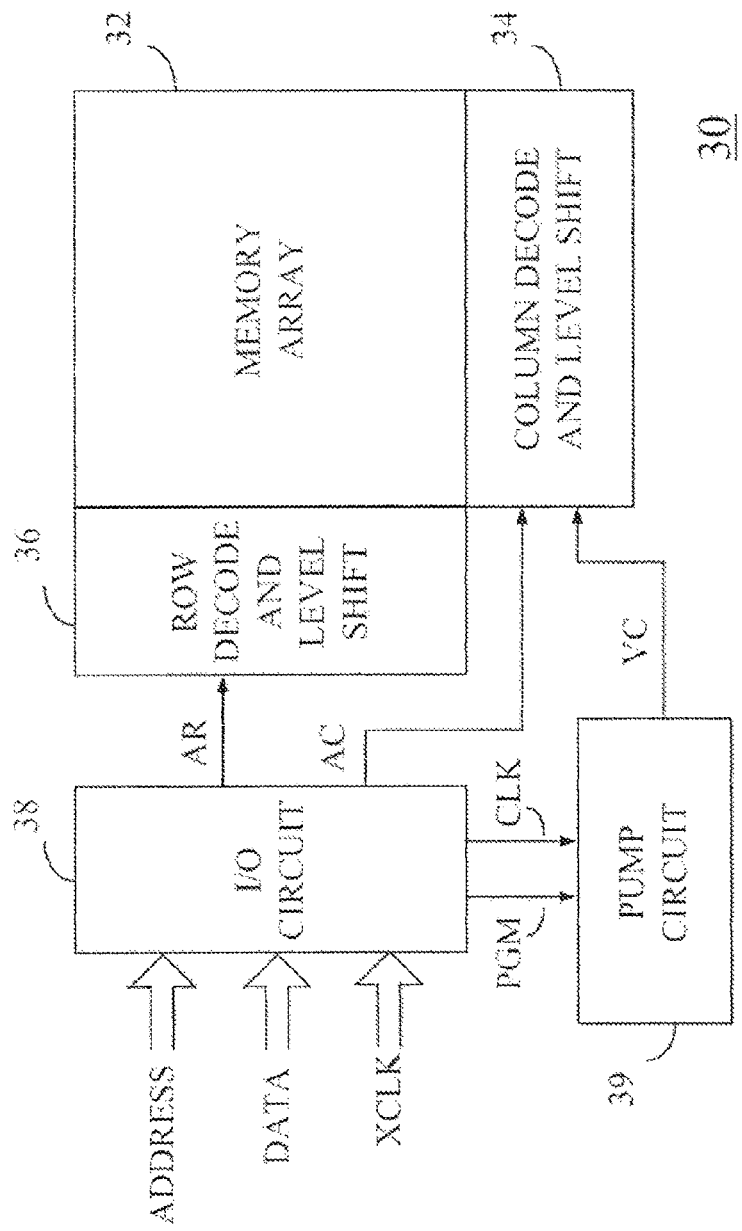
FIG. 3 shows a block diagram of a prior art nonvolatile semiconductor memory device.
Figure 4:
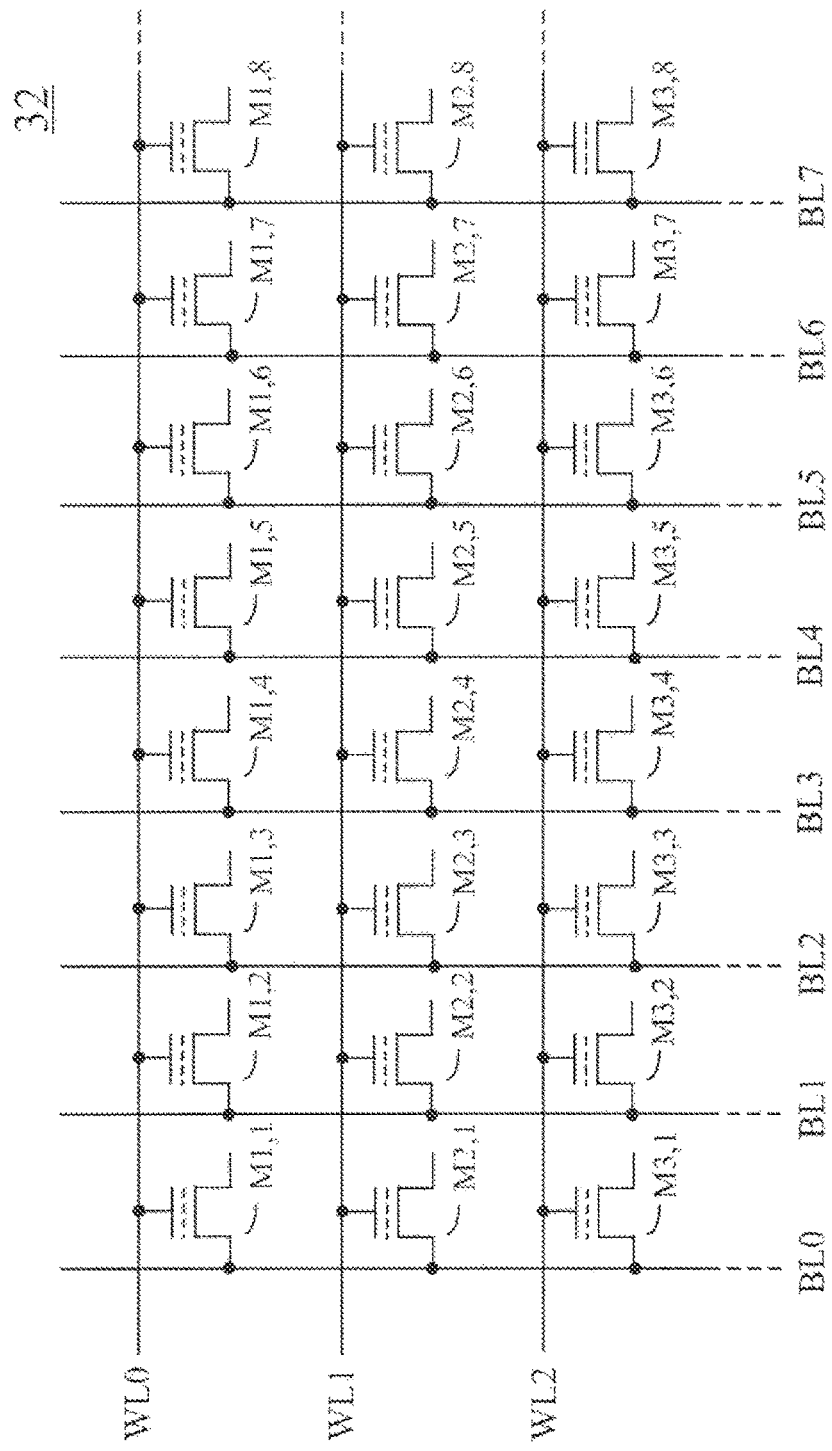
FIG. 4 shows a part of the memory array of FIG. 3.
Figure 5:
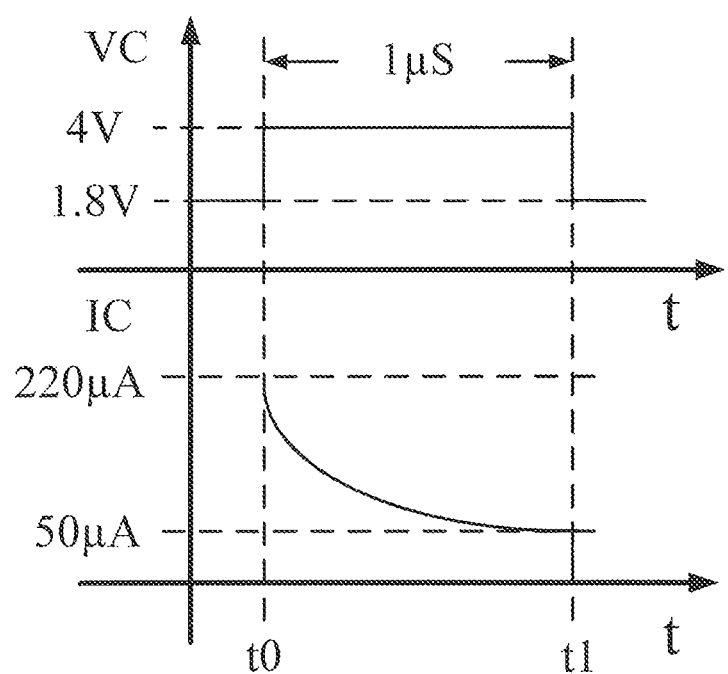
FIG. 5 shows a plot of voltage and current waveforms versus time of a typical prior art programming operation.
Figure 6:
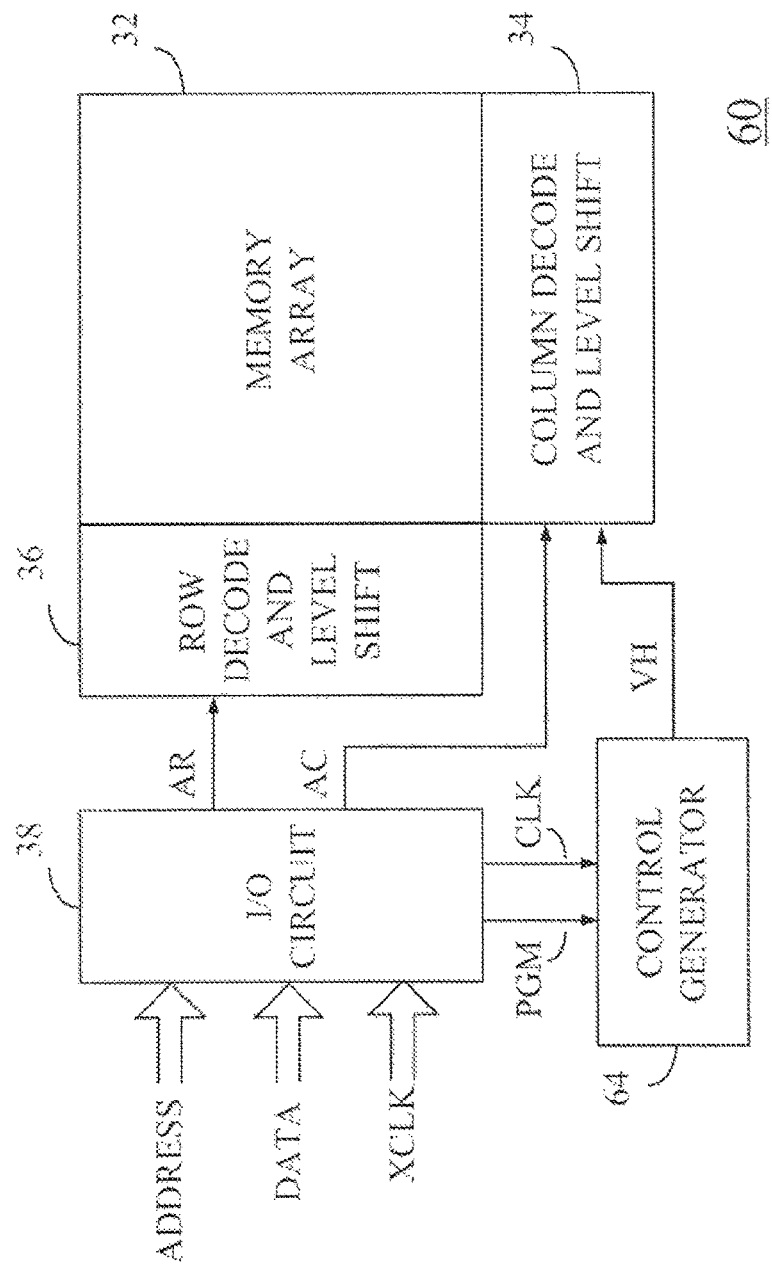
FIG. 6 shows a block diagram of a nonvolatile semiconductor memory device according to one embodiment of the present invention.

In order to explain the method for programming a plurality of memory cells of a nonvolatile semiconductor memory device of the present invention, the nonvolatile semiconductor memory device that performs the method of the present invention will be described herein. FIG. 6 shows a block diagram of a nonvolatile semiconductor memory device 60 according to one embodiment of the present invention. Referring to FIG. 6, the memory device 60 comprises the memory array 32, the column decode and level shift circuit 34, the row decode and level shift circuit 36, and the I/O circuit 38 as shown in FIG. 3, and further comprises a control circuit 64.

Figure 7:
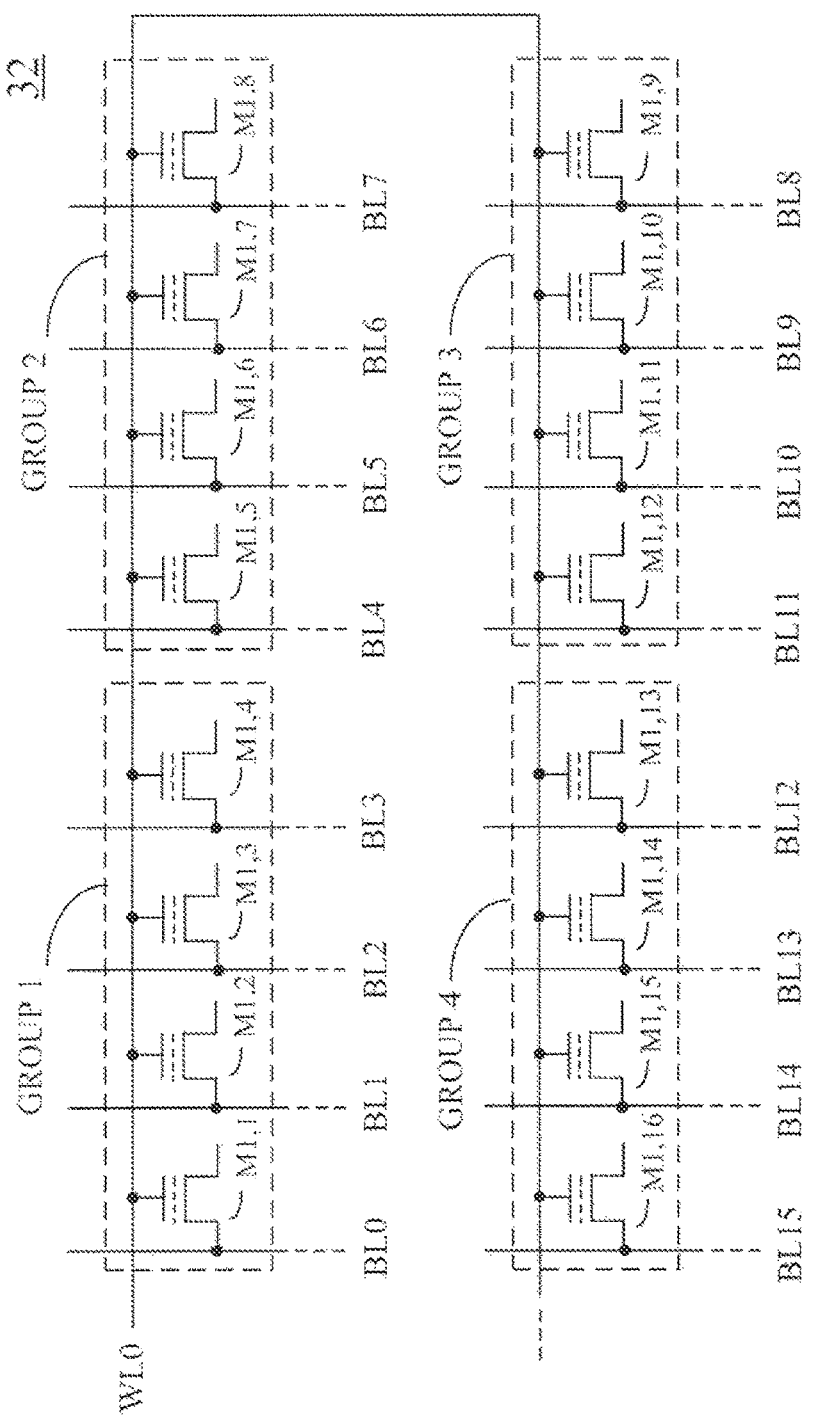
FIG. 7 shows a part of the memory array of FIG. 6.

FIG. 7 shows a part of the memory array 32 of FIG. 6. For the purpose of conciseness, the memory array 32 shown in FIG. 7 comprising a single word line WL0, first to sixteenth bit lines BL0 to BL15, and first to sixteenth memory cell transistors M1,1 to M1,16 is exemplified. However, the present invention is not limited to such a configuration. Referring to In another embodiment as shown in FIG. 7, the first to sixteenth memory cell transistors M1,1 to M1,16 are arranged in the form of a matrix, and each memory cell transistor is connected to the word line WL0 and to one of the bit lines BL0 to BL15. As shown in FIG. 7, the first to sixteenth memory cell transistors M1,1 to M1,16 are divided into first to fourth groups GROUP1, GROUP2, GROUP3, and GROUP4. In this embodiment, each of the groups is composed of four memory cell transistors.

Referring now to FIG. 6, to program the first to sixteenth memory cell transistors M1,1 to M1,16 in the memory array 32, the control circuit 64 generates a pumped output voltage VH to the column decode and level shift circuit 34 in response to a mode signal PGM issued from the I/O circuit 38. During the program operation, the row decode and level shift circuit 36 selects one of the word lines from the memory array 32 in response to an address signal AR output form the I/O circuit 38, and the column decode and level shift circuit 34 selects a plurality of bit lines from the memory array in response to an address signal AC output form the I/O circuit 38. In this manner, the memory cells of the first to fourth groups GROUP1, GROUP2, GROUP3, and GROUP4 are successively selected, and the pumped voltage VH is applied to the memory cells of the selected group through the selected bit lines.

Figure 8:
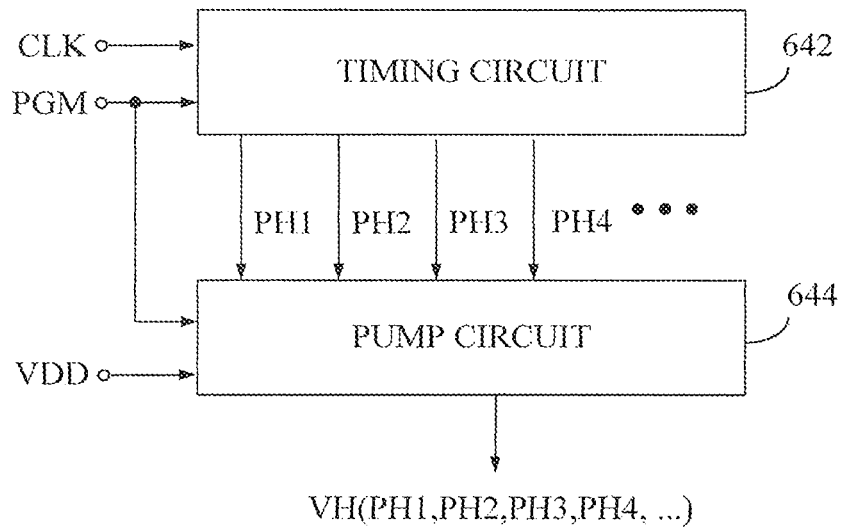
FIG. 8 is a block diagram showing an embodiment of the control circuit of FIG. 6.

FIG. 8 is a block diagram showing an embodiment of the control circuit 64 of FIG. 6. Referring to FIG. 8, the control circuit 64 comprises a timing circuit 642 and a pump circuit 644. The timing circuit 642 receives the mode signal PGM and an internal clock CLK synchronized with an external clock signal XCLK for generating a plurality of successive overlapping pulse signals PH1, PH2, PH3, and PH4 during the program operation. The pump circuit 644 generates the pumped output voltage VH in response to the pulse signals PH1, PH2, PH3, and PH4, wherein the level of the voltage VH is higher than a power supply VDD when the pump circuit 644 is activated. In this embodiment, the pump circuit 644 is an internal circuit. In an alternative embodiment of the present invention, the pump circuit 644 may be implemented outsize the memory device 60 so as to minimize circuit size and complexity.

Figure 9:
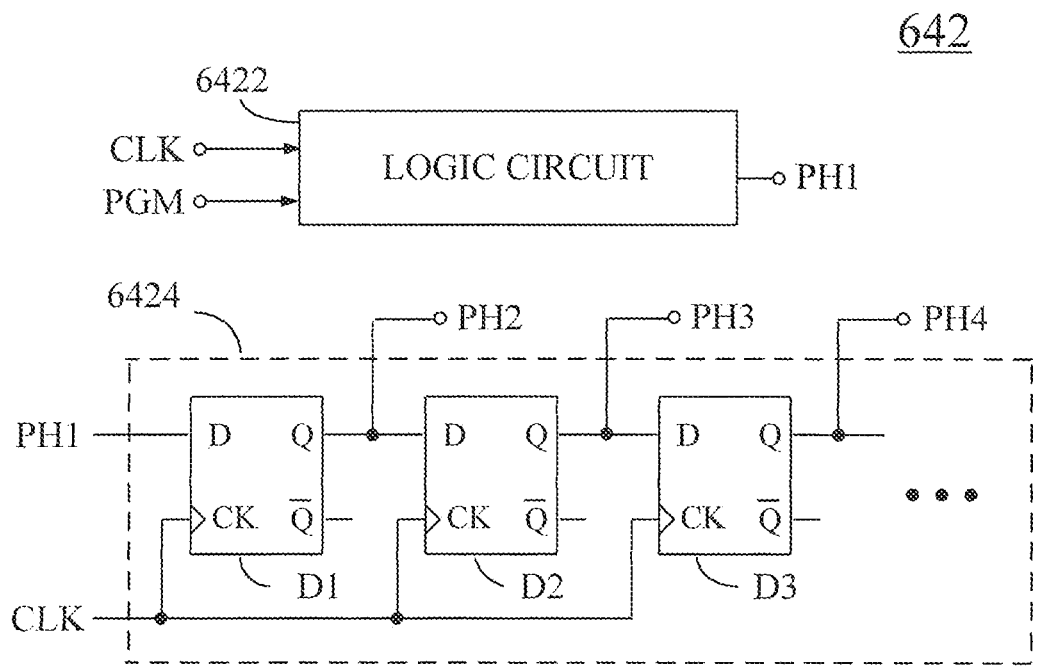
FIG. 9 is a circuit diagram showing an embodiment of the timing circuit of FIG. 6.

FIG. 9 is a circuit diagram showing an embodiment of the timing circuit 642 of FIG. 6. Referring to FIG. 9, the timing circuit 642 comprises a logic circuit 6422 and a delay circuit 6424. The logic circuit 6422 receives the clock signals CLK and the mode signal PGM for generating the first pulse signal PH1. The delay circuit 6424 is composed of three serial-connected D flip-flops D1, D2, and D3. The delay circuit 6424 is used to generate a plurality of delayed versions of the input signal PH1 at a predetermined delay as successive overlapping pulse signals.

Figure 10:
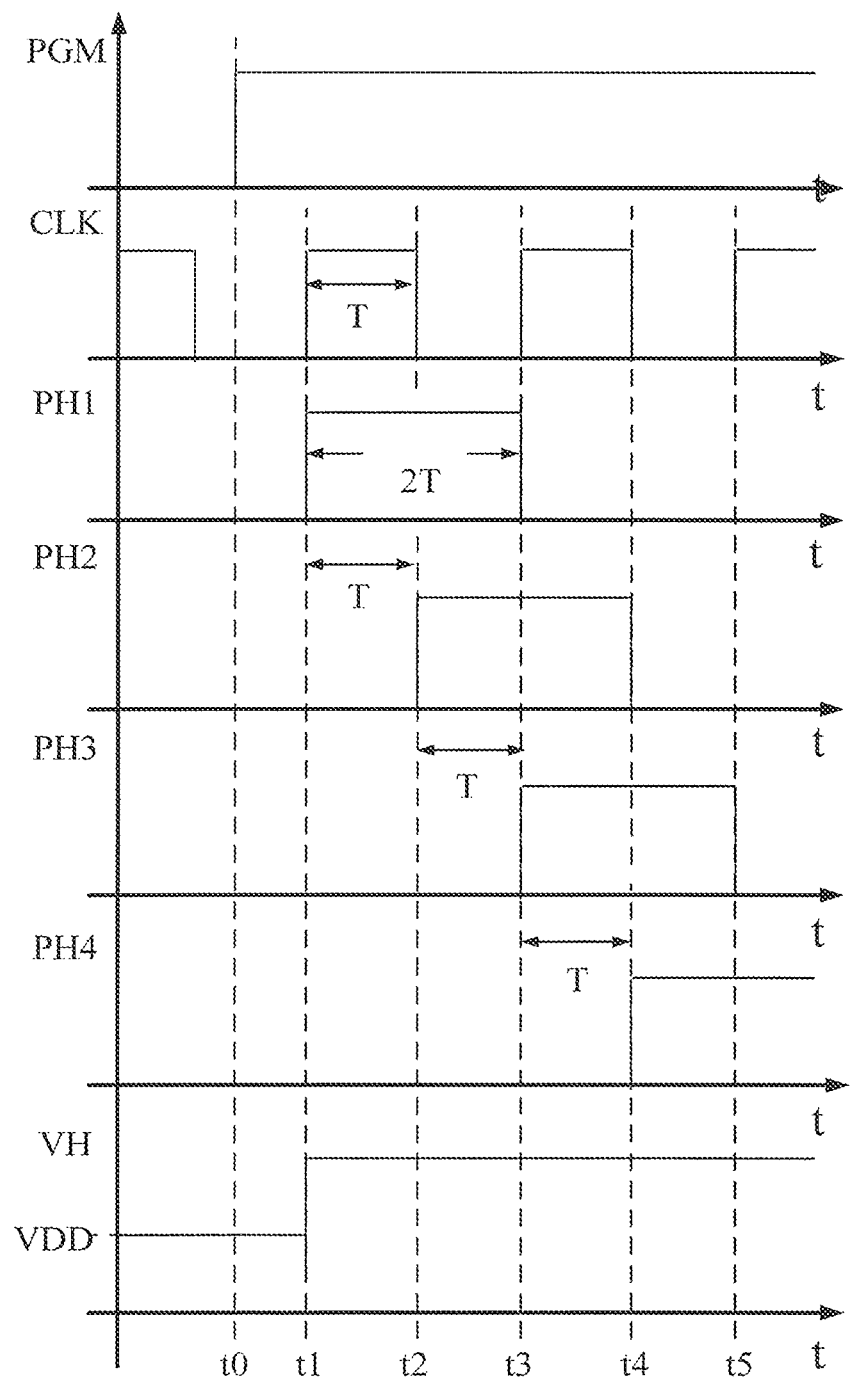
FIG. 10 is a timing diagram showing an embodiment of an operation of the timing circuit of FIG. 9.

FIG. 10 is a timing diagram showing an embodiment of an operation of the timing circuit 642 of FIG. 9. Referring to FIG. 10, at time t1, the first pulse signal PH1 is activated in response to the rising edge of the clock signal CLK when the mode signal PGM is activated. In this embodiment, the pulse width of the pulse signal PHI is equal to 2×T, wherein T is the time period of the clock signal CLK.

Referring to FIG. 9 and FIG. 10, upon receiving the pulse signal PH1, the D flip-flop D1 of the delay circuit 6424 generates a delayed version of the input signal PH1 at a predetermined delay T at time t2. Thereafter, the D flip-flop D2 receives the delayed signal PH2 from the D flip-flop D1 for generating a delayed version of the signal PH2 at a predetermined delay T at time t3. Then, the D flip-flop D3 receives the delayed signal PH3 from the D flip-flop D2 for generating a delayed version of the signal PH3 at a predetermined delay T at time t4. In this manner, the delay circuit can generate successive pulse signals PH1, PH2, PH3, and PH4 having the same overlapping amount of T as shown in FIG. 10.

In the above embodiment, each pulse width of the pulse signals PH1 to PH4 is equal to 2×T and the overlapping amount of the pulse signals PHI to PH4 is equal to T. However, the pulse width and the overlapping amount of the pulse signals can be adjusted to any value. For example, the pulse width of the pulse signals PH1 to PH4 can be designed to be a multiple of the time period T, and the overlapping amount between two successive pulse signals can be varied.

Figure 11:
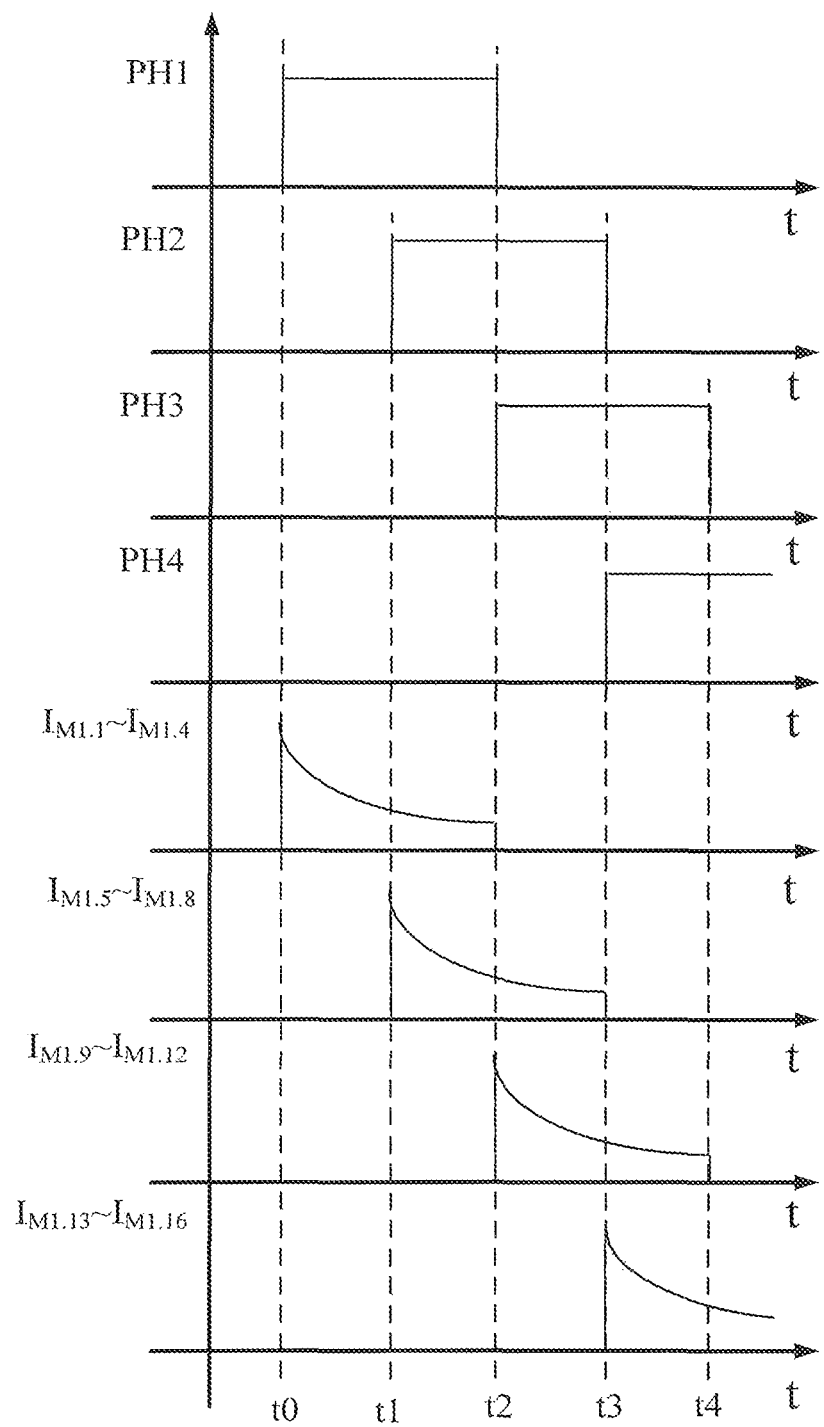
FIG. 11 is a timing diagram showing an embodiment of an operation of the memory device during the programming operation.

FIG. 11 is a timing diagram showing an embodiment of an operation of the memory device 60 during the programming operation. Hereinafter, the detailed program operation in accordance with one embodiment of the present invention is introduced with reference to FIG. 6 to FIG. 11. Referring to FIG. 6 and FIG. 11, during the time period t1 to t3, the first group GROUP1 in the memory array 32 is selected by the circuits 32 and 34 first. Therefore, the pumped voltage VH is applied to the memory cells M1,1, M1,2, M1,3, and M1,4 of the group GROUP1 through the bit lines BL0, BL1, BL2, and BL3 shown in FIG. 7. Thereafter, the second group GROUP2 is selected by the circuits 32 and 34 during the time period t2 to t4, and the pumped voltage VH is applied to the memory cells M1,5, M1,6, M1,7, and M1,8 of the group GROUP2 through the bit lines BL4, BL5, BL6, and BL7. During the time period t3 to t5, the third group GROUP3 is selected by the circuits 32 and 34, and the pumped voltage VH is applied to the memory cells M1,9, M1,10, M1,11, and M1,12 of the group GROUP3 through the bit lines BL8, BL9, BL10, and BL11. In this manner, the groups of the memory devices 60 are successively selected, and the pumped voltage VH is applied to the memory cells of the selected group during the program operation.

Referring to FIG. 11, since the memory cell transistors M1,1 to M1,16 in FIG. 7 are divided into a plurality of groups and the program operations for the memory cells in each group are performed in turn, the instantaneous power consumption of the entire operation can be relatively low. Furthermore, because the pulse signals for programming each group are overlapping each other, the entire program duration of the memory cells can is be significantly reduced according to the present invention.

The above-described embodiments of the present invention are intended to be illustrative only. Numerous alternative embodiments may be devised by those skilled in the art without departing from the scope of the following claims.

What is claimed is:

1. A nonvolatile semiconductor memory device comprising:
    a plurality of memory cells divided into M number of groups (M is an integer);
    a decoder for successively selecting each of the M number of groups;
    a logic circuit for receiving a clock signal and a mode signal so as to generate a first pulse signal, and
    a delay circuit for receiving the first pulse signal so as to generate M number of successive overlapping pulse signals in response to the clock signal,
    wherein the memory cells of the M number of groups are configured so as to be programmable in response to the respective M number of successive overlapping pulse signals, and
    wherein a pulse width and an overlapping amount of each of the M number of successive overlapping control pulse signals are adjustable by varying a pulse width of the clock signal.

2. The nonvolatile semiconductor memory device of claim 1, further comprising:
    a pump circuit for generating a pumped voltage having a level higher than a power supply in response to the M number of successive overlapping pulse signals;
    wherein the memory cells of the M number of groups are configured to be programmable in response to the pumped voltage.

3. The nonvolatile semiconductor memory device of claim 1, wherein when the pulse width of the clock signal is equal to T, the pulse width of the each of the M number of successive overlapping control pulse signals is equal to 2×T, and the overlapping amount of each of the M number of successive overlapping control pulse signals is equal to T.

4. The nonvolatile semiconductor memory device of claim 1 wherein the delay circuit comprises M number of serial-connected D flip-flops.

5. The nonvolatile semiconductor memory device of claim 1, wherein the M number of successive overlapping pulse signals are generated in response to a rising edge and a falling edge of the clock signal.

* * * * *